(12) United States Patent
Chang et al.

(10) Patent No.: US 7,184,851 B2
(45) Date of Patent: Feb. 27, 2007

(54) METHOD OF PROVIDING CASSETTES CONTAINING CONTROL WAFERS TO DESIGNATED PROCESSING TOOLS AND METROLOGY TOOLS

(75) Inventors: Yung-Cheng Chang, Tainan (TW); Hsueh-shih Fu, Chu-Tung (TW); Hades Lee, Tainan (TW); Yi-Ping Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/168,608

(22) Filed: Jun. 28, 2005

(65) Prior Publication Data

US 2006/0293780 A1 Dec. 28, 2006

(51) Int. Cl.
*G06F 19/00* (2006.01)
(52) U.S. Cl. ............... 700/112; 700/115; 700/121
(58) Field of Classification Search ........... 700/121, 700/112
See application file for complete search history.

(56) References Cited

U.S. PATENT DOCUMENTS

| | | | |
|---|---|---|---|
| 6,338,005 B1 * | 1/2002 | Conboy et al. ............ 700/213 |
| 6,484,064 B1 * | 11/2002 | Campbell ................. 700/100 |
| 2001/0007085 A1 * | 7/2001 | Sugikawa ................ 700/121 |
| 2002/0165636 A1 * | 11/2002 | Hasan .................... 700/121 |
| 2002/0168806 A1 * | 11/2002 | Tokuyama ................ 438/151 |

* cited by examiner

*Primary Examiner*—Leo Picard
*Assistant Examiner*—Ryan A Jarrett
(74) *Attorney, Agent, or Firm*—Thomas, Kayden, Horstemeyer & Risley

(57) ABSTRACT

A system for tool monitoring is provided. The system comprises a first cassette, a second cassette, a processing tool, a first metrology tool, and a second metrology tool. The first cassette contains a first control wafer used for a first metrology process. The second cassette contains a second control wafer used for a second metrology process. The processing tool receives the first cassette and processes the first control wafer, and receives the second cassette and processes the second control wafer. The first metrology tool receives the first cassette from the processing tool, and performs the first metrology process on the first control wafer processed by the processing tool. The second metrology tool receives the second cassette from the processing tool, and performs the second metrology process on the second control wafer processed by the processing tool.

3 Claims, 12 Drawing Sheets

METHOD OF PROVIDING CASSETTES CONTAINING CONTROL WAFERS TO DESIGNATED PROCESSING TOOLS AND METROLOGY TOOLS

The invention relates to semiconductor manufacturing processes, and more particularly, to a system and method for facilitating discovery of defective tools in a semiconductor manufacturing system.

In order to produce a particular circuitry on a semiconductor wafer, a wafer has to pass through hundreds of processing steps. These processing steps involve depositing material layers and forming patterns on these material layers by photolithography, ion implantation, thermal annealing, and other processes. Each of the processing steps is monitored to detect errors.

Tools for performing processing steps are monitored periodically using control wafers. Different types of control wafers are used for monitoring different processing features for a particular tool. A control wafer is first processed by a tool, and undergoes a metrology process to determine whether the tool is operating normally.

FIG. 1 illustrates operation in a conventional manufacturing system. Manufacturing system 10 comprises a material handling facility 11, a processing facility 13, and a metrology facility 15.

The material handling facility 11 handles a plurality of cassettes, each of which contains a plurality of control wafers used for different metrology process. The cassettes are stored in a stocker 111, and transported by a transporter (not shown). For example, cassette A comprises control wafers A1~A25 used for a particle monitoring process; cassette B comprises control wafers B1~B25 used for a thickness monitoring process; and cassette C comprises control wafers C1~C25 used for an overlay monitoring process.

The processing facility 13 comprises processing tools 131, 133, and 135. Each of the processing tools 131, 133, and 135 is monitored once a day using the control wafers stored in the cassettes A, B, and C, respectively.

The metrology facility 15 comprises metrology tools 151, 153, and 155. The metrology tool 151 performs a particle metrology process. The metrology tool 153 performs a thickness metrology process. The metrology tool 155 performs an overlay metrology process.

When processing tool 131 is to be monitored, a sorter 12 retrieves a control wafer from cassettes A, B, and C, respectively. For example, control wafers A1, B1, and C1 are retrieved from cassettes A, B, and C, respectively. The retrieved control wafers A1, B1, and C1 are loaded into another cassette 121. Here, the cassette may be a Front Opening Unified Pod (FOUP) or other type of wafer carrier. The cassette 121, containing control wafers A1, B1, and C1, is transported to the processing tool 131. After the cassette 121 is loaded onto processing tool 131, control wafers A1, B1, and C1 are processed by processing tool 131. The cassette 121 containing control wafers A1, B1, and C1 is then transported to metrology tool 151. The cassette 121 is then loaded onto the metrology tool 151, and a particle metrology process is performed on control wafer A1. After the particle metrology process, the cassette is then transferred to the metrology tool 153. In metrology tool 153, a thickness metrology process is performed on the control wafer B1. After the thickness metrology process, the cassette 121 is transferred to the metrology tool 155. In metrology tool 155, an overlay metrology process is performed on the control wafer C1. The results, obtained in the particle metrology process, the thickness metrology process, and the overlay metrology process, are transmitted to an analysis system 17 for further processing.

Many disadvantages, however, exist in the conventional tool monitoring operation. The sorting operation is time consuming, and control wafers may be damaged during the sorting process. Additionally, waiting for an available FOUP to transport the control wafers is also time consuming. Hence, there is a need for a system that addresses problems arising from the existing technology.

SUMMARY

A tool monitoring system for discovering defective tools is provided. The system comprises a first cassette, a second cassette, a processing tool, a first metrology tool, and a second metrology tool. The first cassette contains a first control wafer used for a first metrology process. The second cassette contains a second control wafer used for a second metrology process. The processing tool receives the first cassette and processes the first control wafer, and receives the second cassette and processes the second control wafer. The first metrology tool receives the first cassette from the processing tool, and performs the first metrology process on the first control wafer processed by the processing tool. The second metrology tool receives the second cassette from the processing tool, and performs the second metrology process on the second control wafer processed by the processing tool.

Also disclosed is a manufacturing system implementing tool monitoring processes. The manufacturing system comprises a material handling facility, a processing facility, and a metrology facility. The material handling facility handles a first cassette and a second cassette. The first cassette contains a plurality of first control wafers used for a first metrology process. The second cassette contains a plurality of second control wafers used for a second metrology process. The processing facility comprises a first processing tool and a second processing tool. The first processing tool receives the first cassette and processes one of the first control wafers, and receives the second cassette and processes one of the second control wafers. The second processing tool receives the first cassette and processes a first control wafer selected from the rest of the plurality of first control wafers, and receives the second cassette and processes a second control wafer selected from the rest of the plurality of second control wafers. The metrology facility comprises a first metrology tool and a second metrology tool. The first metrology tool receives the first cassette from the first processing tool and performs the first metrology process on the first control wafer processed by the first processing tool, and receives the first cassette from the second processing tool and performs the first metrology process on the first control wafer processed by the second processing tool. The second metrology tool receives the second cassette from the first processing tool and performs the second metrology process on the second control wafer processed by the first processing tool, and receives the second cassette from the second processing tool and performs the second metrology process on the second control wafer processed by the second processing tool.

Also disclosed is a method for tool monitoring. A first cassette, containing a plurality of first control wafers used for a first metrology process is provided. The first cassette is then loaded onto a first processing tool. One of the first control wafers is processed using the first processing tool.

The first cassette is then loaded onto a first metrology tool. The first metrology tool performs the first metrology process on the first control wafer processed by the first processing tool.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION

The invention will now be described with reference to FIGS. 2 through 5, which generally relate to a system of tool monitoring.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the figures corresponds to the Figure number, with the exception that the same reference number is used throughout to refer to an identical component which appears in multiple figures.

Figure 1:
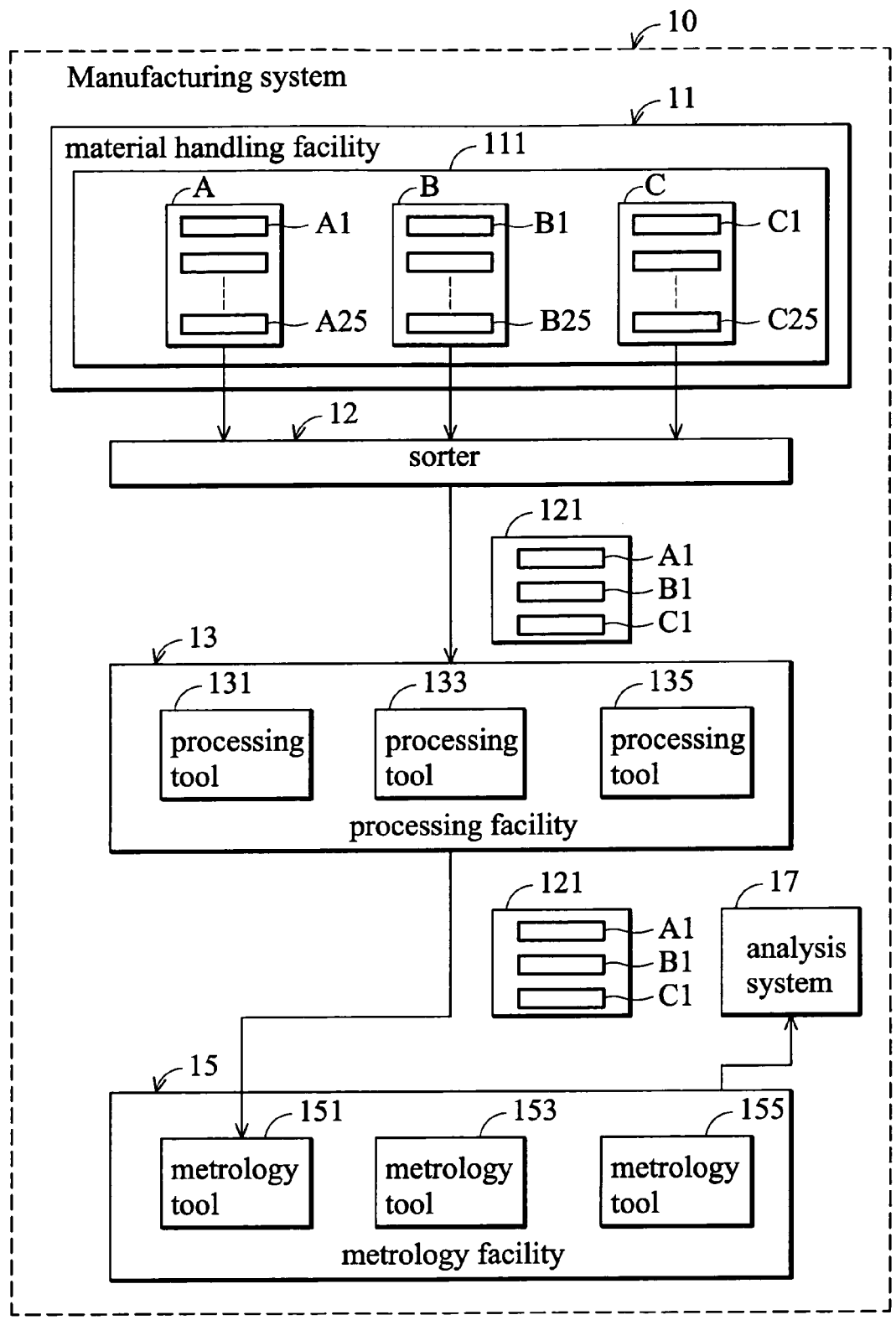
FIG. 1 illustrates a schematic view of operation of tool monitoring in a conventional manufacturing system.
Figure 2:
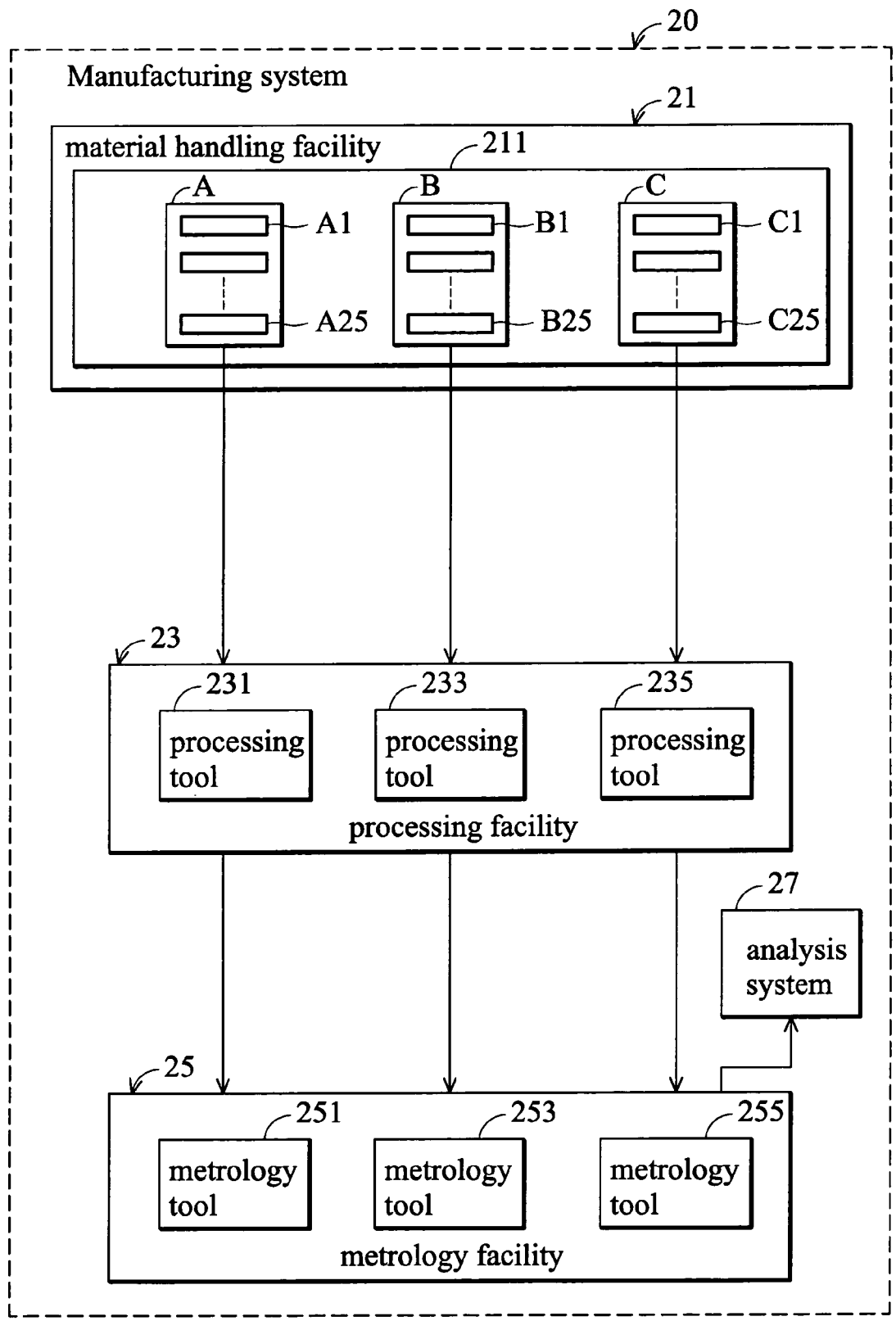
FIG. 2 illustrates a schematic view of operation of tool monitoring in an embodiment of a manufacturing system.

FIG. 2 illustrates a schematic view of operation of tool monitoring in an embodiment of a manufacturing system. Manufacturing system 20 comprises a material handling facility 21, a processing facility 23, and a metrology facility 25.

The material handling facility 21 handles a plurality of cassettes containing a plurality of control wafers used for different metrology process. The cassettes are stored in a stocker 211, and transported by a transporter (not shown). For example, cassette A comprises control wafers A1~A25 used for a particle monitoring process; cassette B comprises control wafers B1~B25 used for a thickness monitoring process; and cassette C comprises control wafers C1~C25 used for an overlay monitoring process.

The processing facility 23 comprises processing tools 231, 233, and 235, each of which is monitored once a day using the control wafers stored in the cassettes A, B, and C, respectively.

The metrology facility 25 comprises metrology tools 251, 253, and 255. The metrology tool 251 performs a particle metrology process. The metrology tool 253 performs a thickness metrology process. The metrology tool 255 performs an overlay metrology process.

When the processing tool 231 is to be monitored, cassettes A, B, and C are transported and loaded thereto, respectively. Here, the cassette may be a FOUP or other type of wafer carrier. The cassette A, containing control wafers A1~A25, is transported to the processing tool 231. After the cassette A is loaded onto processing tool 231, one of the control wafers A1~A25 is retrieved and processed by the processing tool 231. For example, control wafer A1 is selected and processed by the processing tool 231. The cassette A, containing control wafers A1~A25, is then transported to the metrology tool 251. Then cassette A is then loaded onto the metrology tool 251, and a particle metrology process is performed on control wafer A1.

Then cassette B, containing control wafers B1~B25, is transported to the processing tool 231. After the cassette B is loaded onto processing tool 231, one of the control wafers B1~B25 is retrieved and processed by the processing tool 231. Here, control wafer B1 is selected and processed by the processing tool 231. The cassette B, containing control wafers B1 B25, is then transported to the metrology tool 253. In metrology tool 253, a thickness metrology process is performed on the control wafer B1.

Then cassette C, containing control wafers C1~C25, is transported to the processing tool 231. After the cassette C is loaded onto processing tool 231, one of the control wafers C1~C25 is retrieved and processed by the processing tool 231. Here, control wafer C1 is selected and processed by the processing tool 231. The cassette C containing control wafers C1~C25 is then transported to the metrology tool 255. In metrology tool 255, an overlay metrology process is performed on the control wafer C1.

The results, obtained in the particle metrology process, the thickness metrology process, and the overlay metrology process, are transmitted to an analysis system 27 for further processing.

FIG. 3A~3D illustrates a flowchart of an embodiment of a tool monitoring method.

Figure 3A:
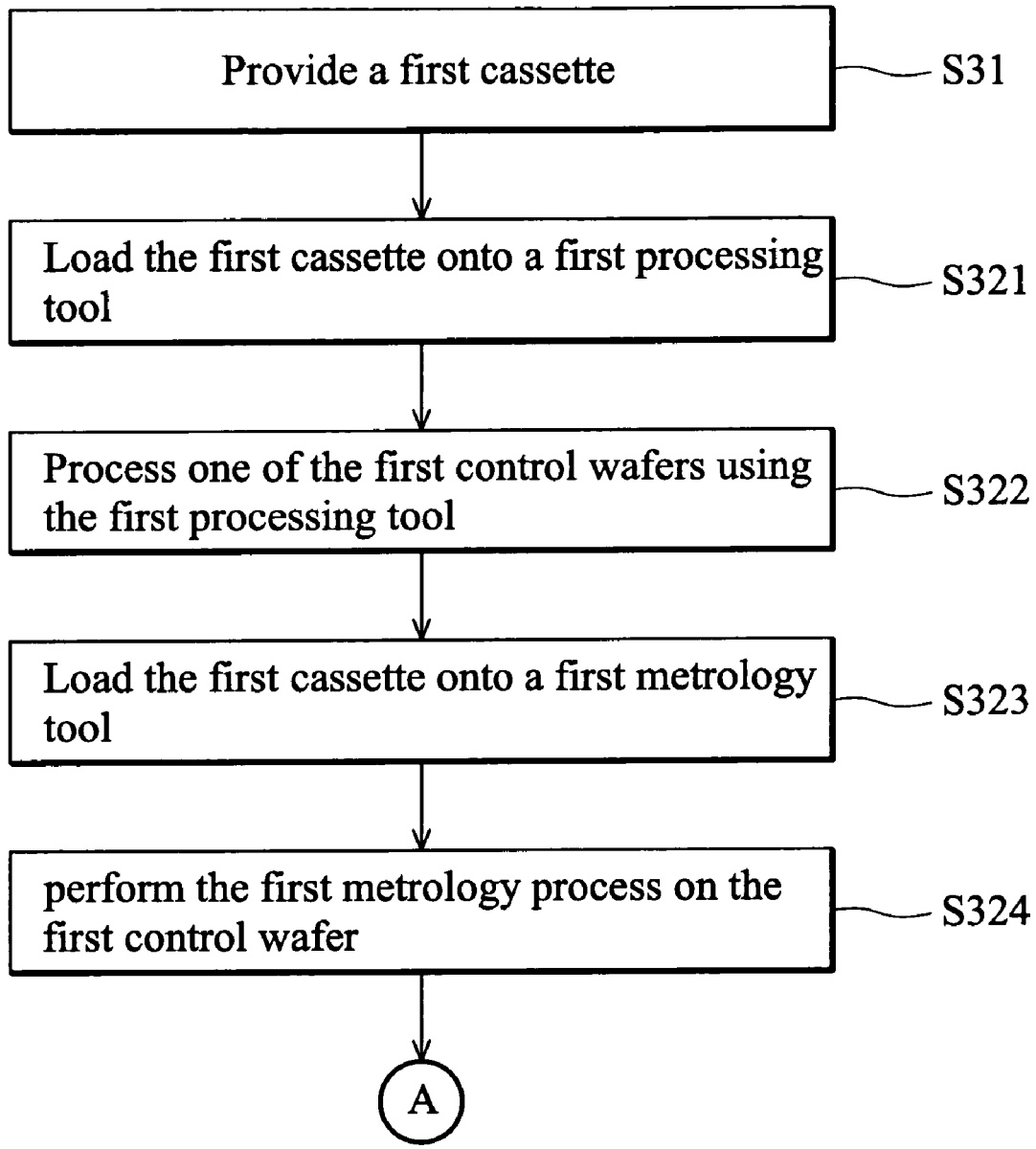
FIG. 3 illustrates a flowchart of an embodiment of a tool monitoring method.

In FIG. 3A, first cassette is provided (step S31), containing a plurality of first control wafers used for a first metrology process.

The first cassette is then loaded onto a first processing tool (step S321). One of the first control wafers is processed using the first processing tool (step S322). The first cassette is then loaded onto a first metrology tool (step S323). The first metrology tool performs the first metrology process on the first control wafer processed by the first processing tool (step S324).

The steps S321~324 illustrate operations of using a first control wafer and a first metrology tool for monitoring a first processing tool.

Figure 3B:
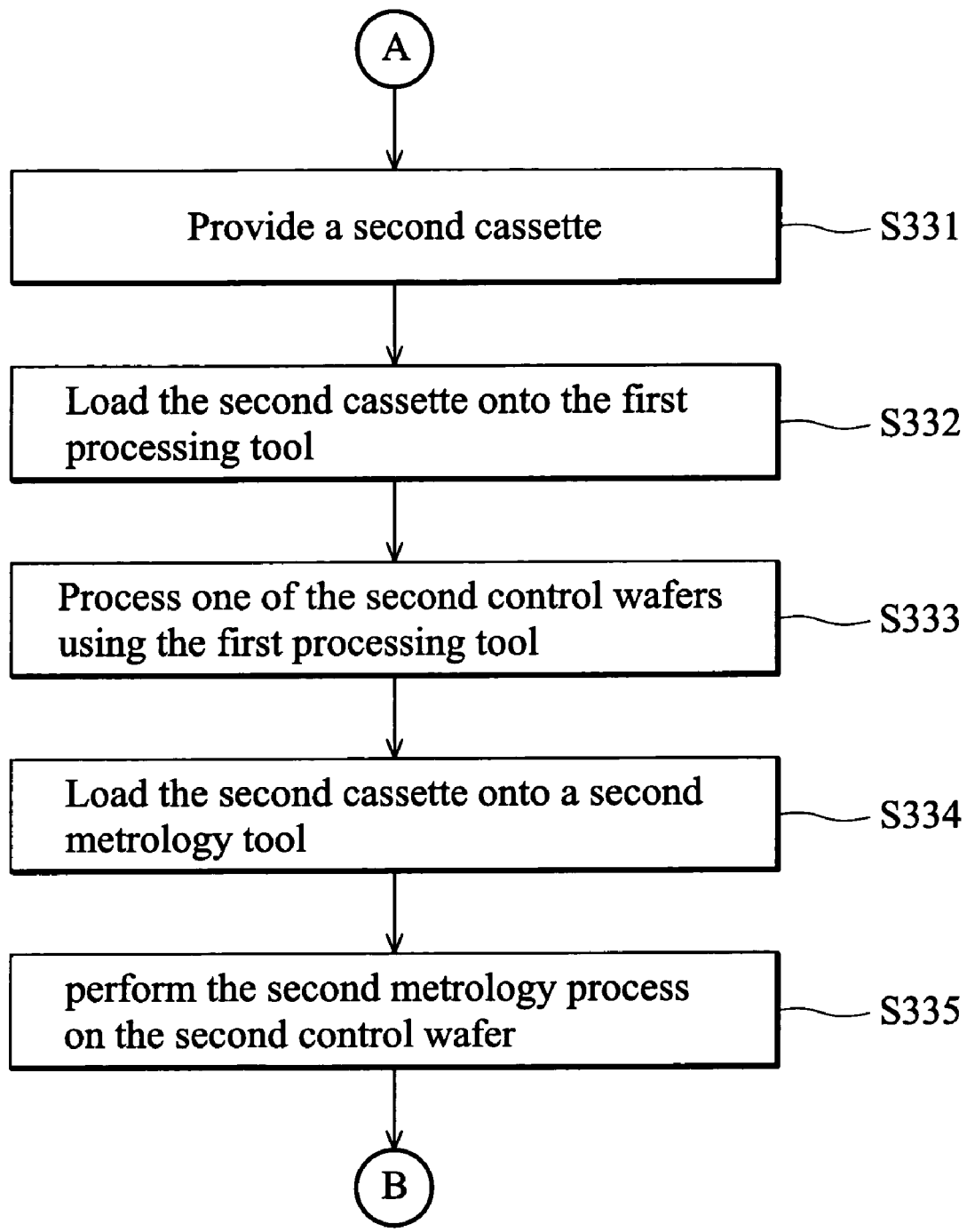

In FIG. 3B, a second cassette is provided in step S331, containing a plurality of second control wafers used for a second metrology process. The second cassette is then loaded onto the first processing tool (step S332). One of the second control wafers is retrieved and processed using the first processing tool (step s333). The second cassette is loaded onto a second metrology tool (step S334). The second metrology tool performs the second metrology process on the second control wafer processed by the first processing tool (step S335).

The steps S331~335 illustrate operations of using a second control wafer and a second metrology tool for monitoring a first processing tool.

Figure 3C:
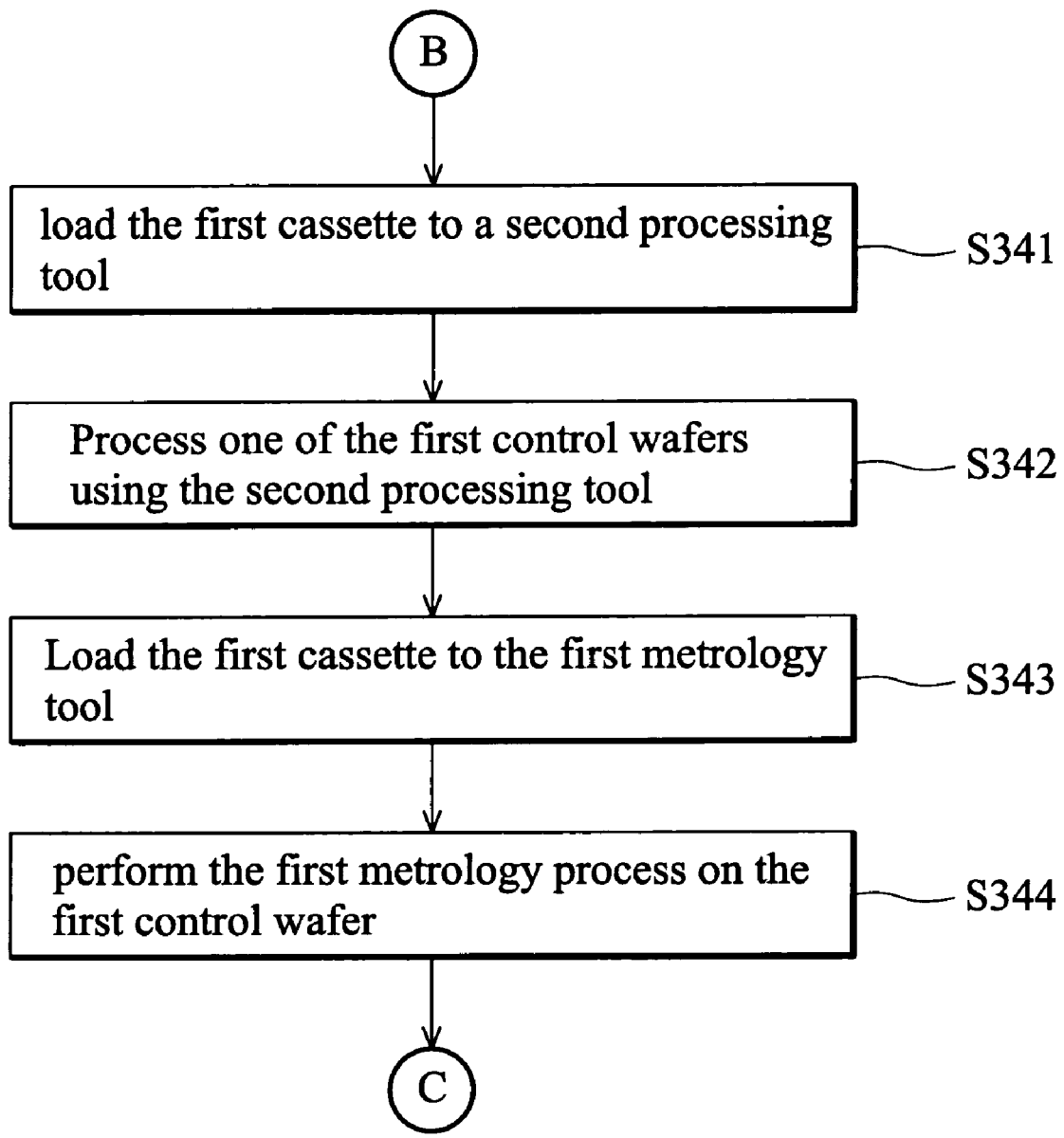

In FIG. 3C, the first cassette is then loaded to a second processing tool (step S341). One of the first control wafers is processed using the second processing tool (step S342).

The first cassette is then loaded to the first metrology tool (step S343). The first metrology tool performs the first metrology process on the first control wafer processed by the second processing tool (step S344).

The steps S341~344 illustrate operations of using one of the first control wafers and the first metrology tool for monitoring a second processing tool.

Figure 3D:
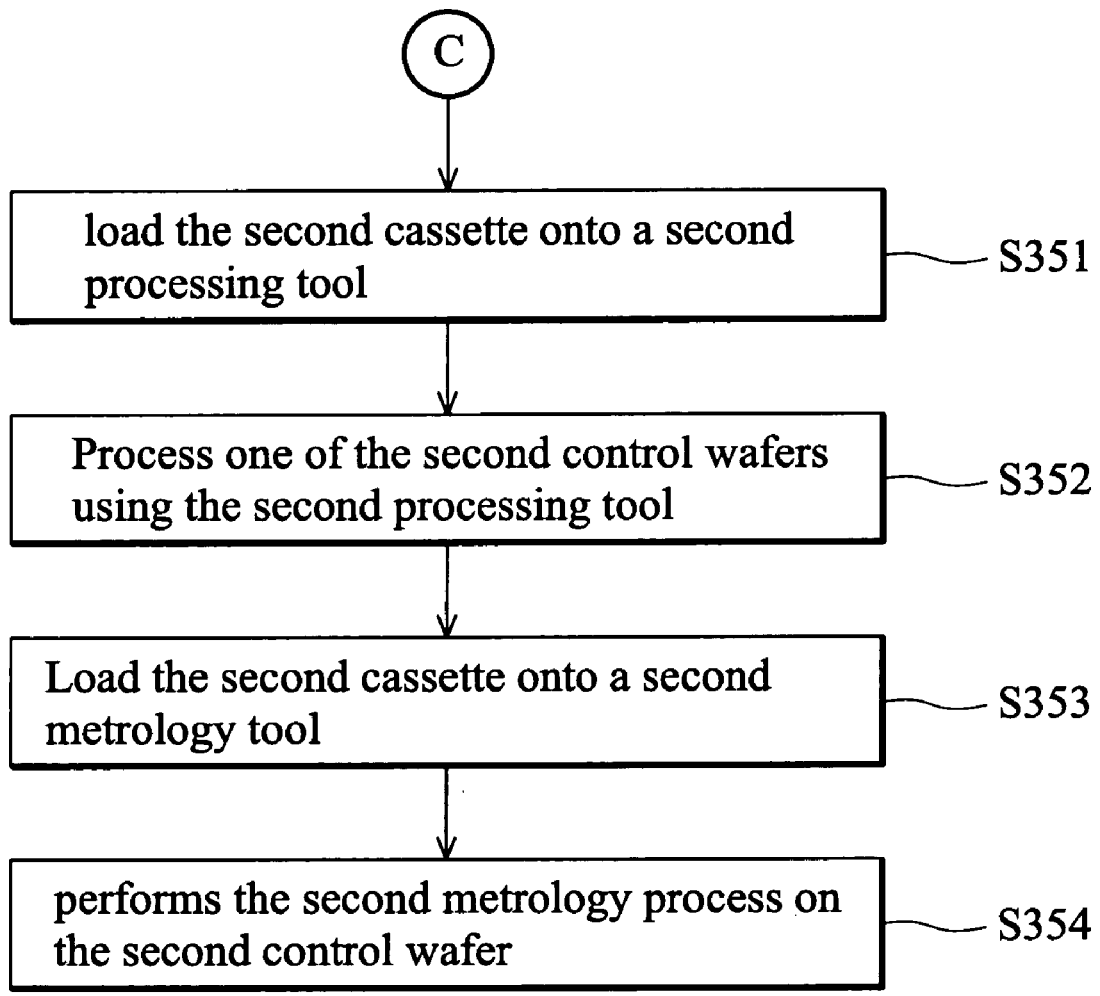

In FIG. 3D, the second cassette used in steps S331~335 is loaded onto a second processing tool (step S351). One of the second control wafers is processed using the second processing tool (step S352). The second cassette is the loaded onto a second metrology tool (step S353). The second metrology tool performs the second metrology process on the second control wafer processed by the second processing tool (step S354).

The steps S351~354 illustrate operations of using one of the second control wafers and the second metrology tool for monitoring a second processing tool.

Figure 4A:
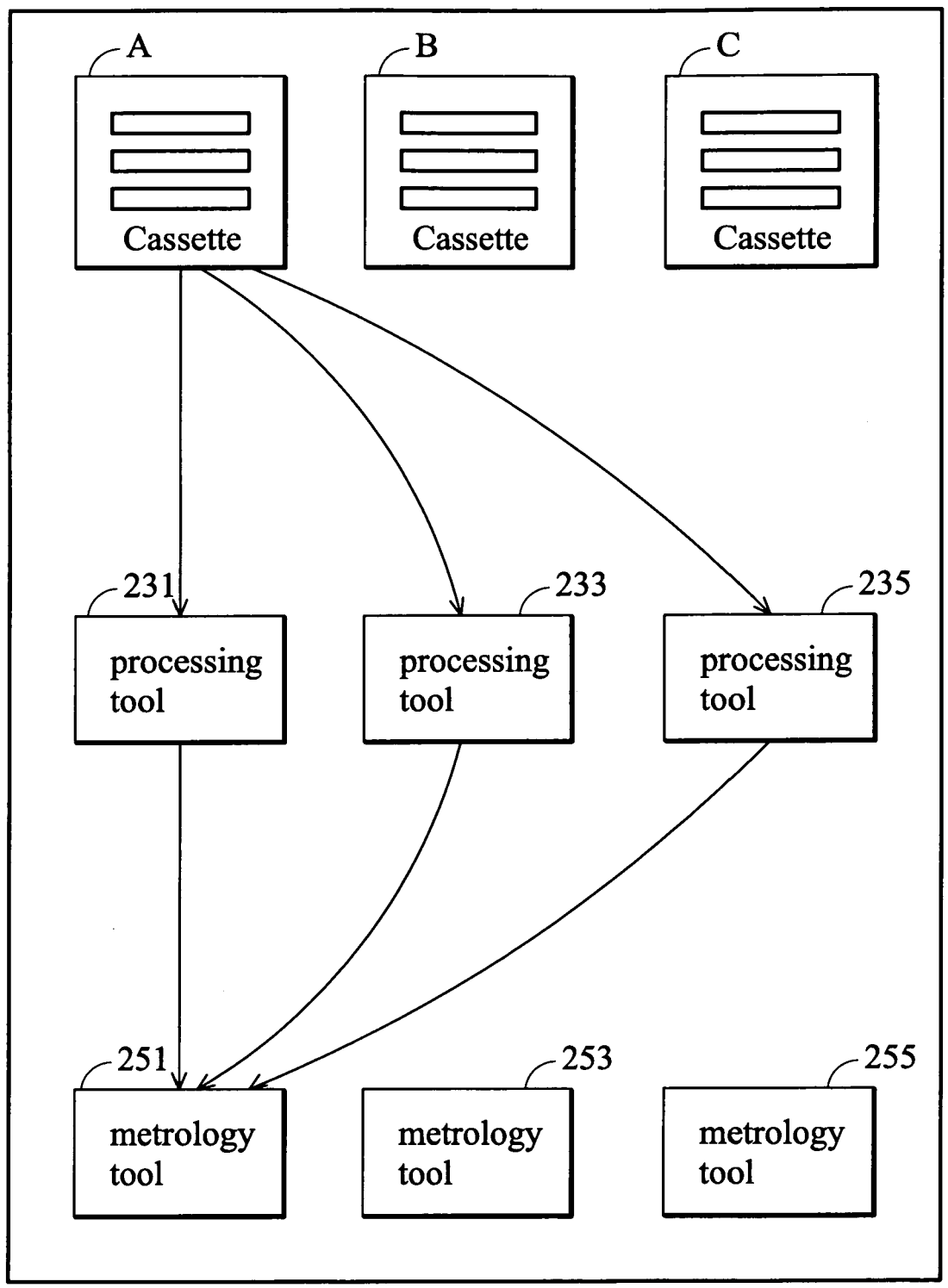
FIGS. 4A~4C illustrate operation of control wafers in an embodiment of tool monitoring.
Figure 4B:
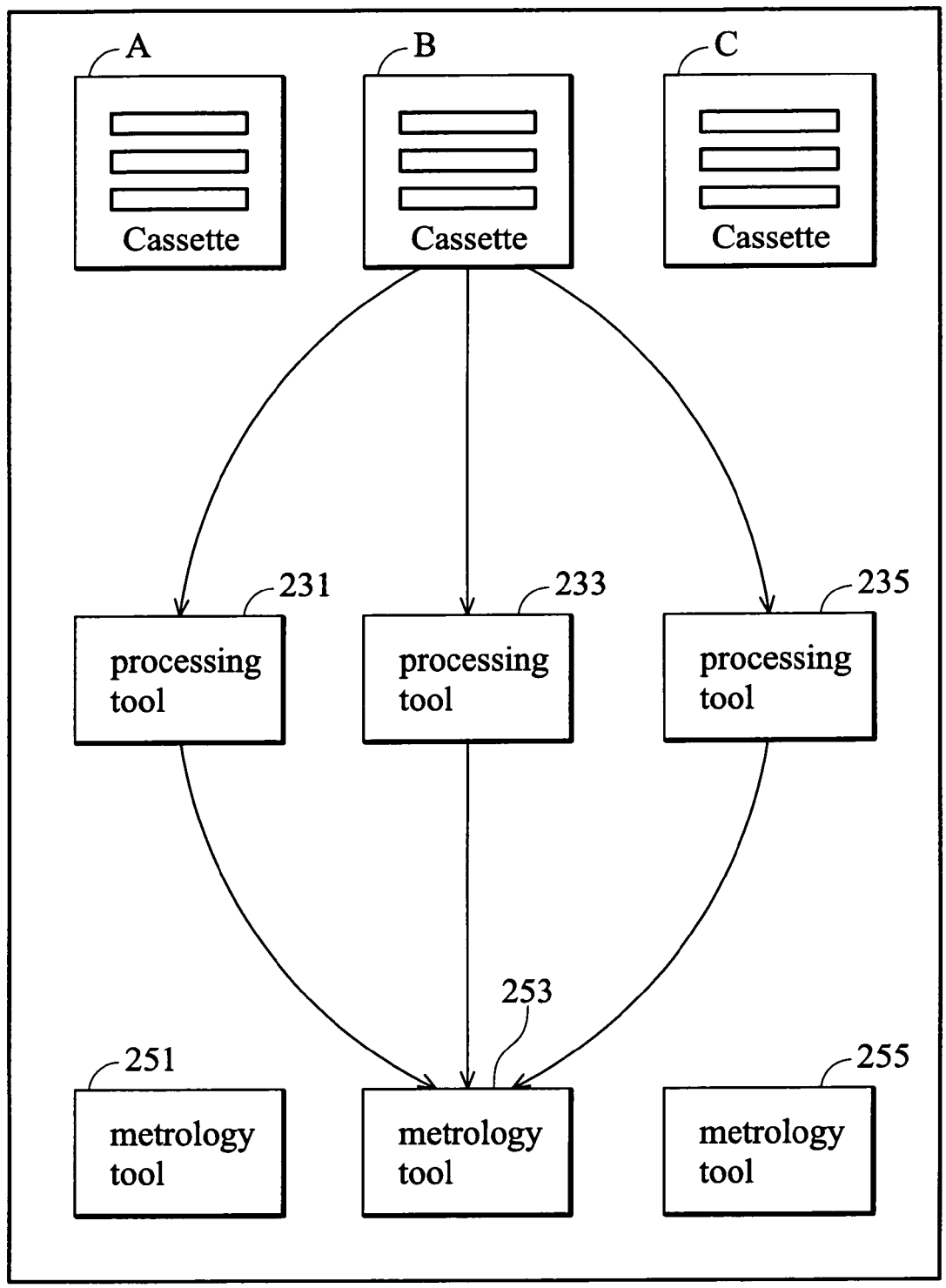
Figure 4C:
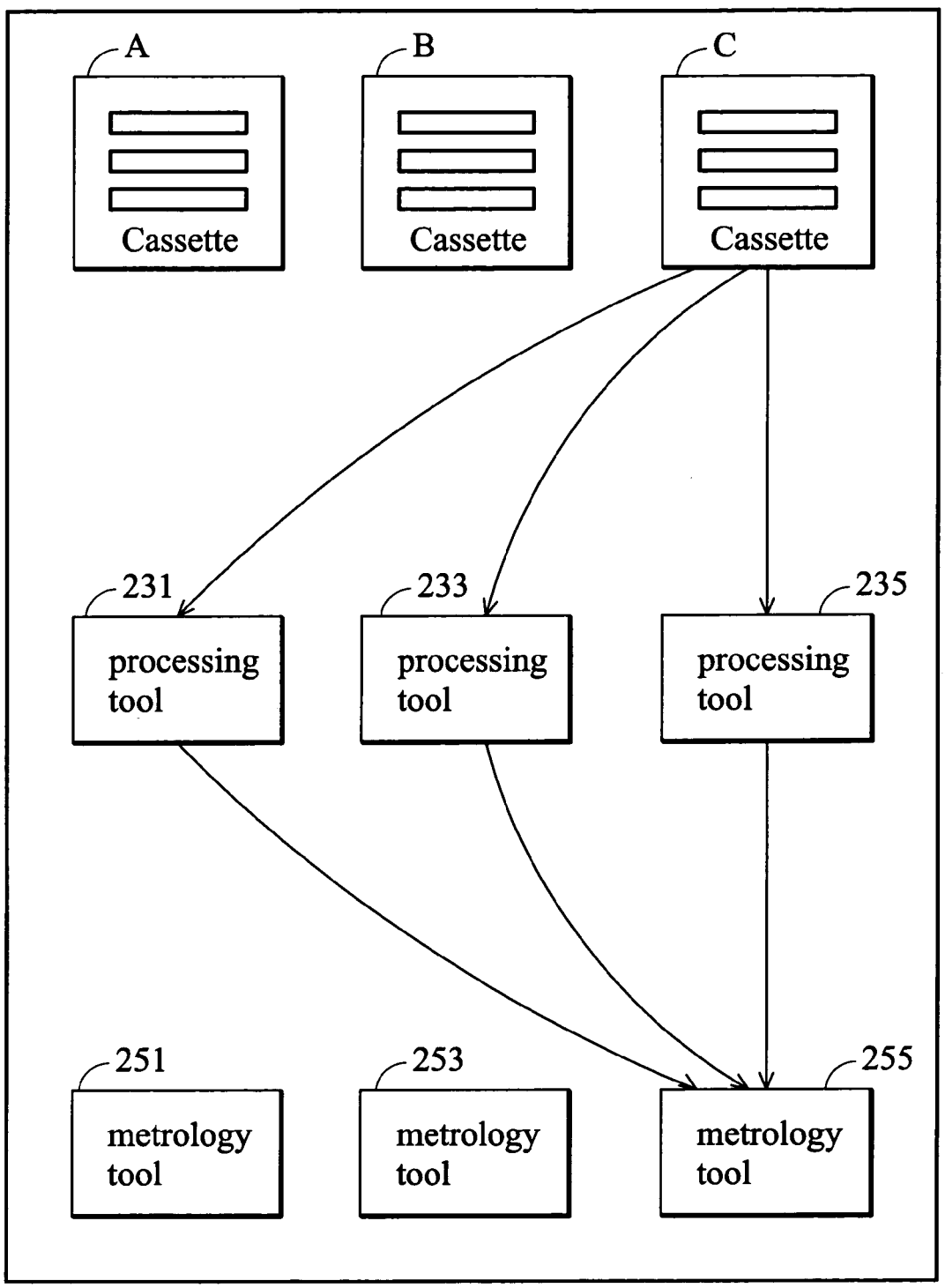
Figure 5A:
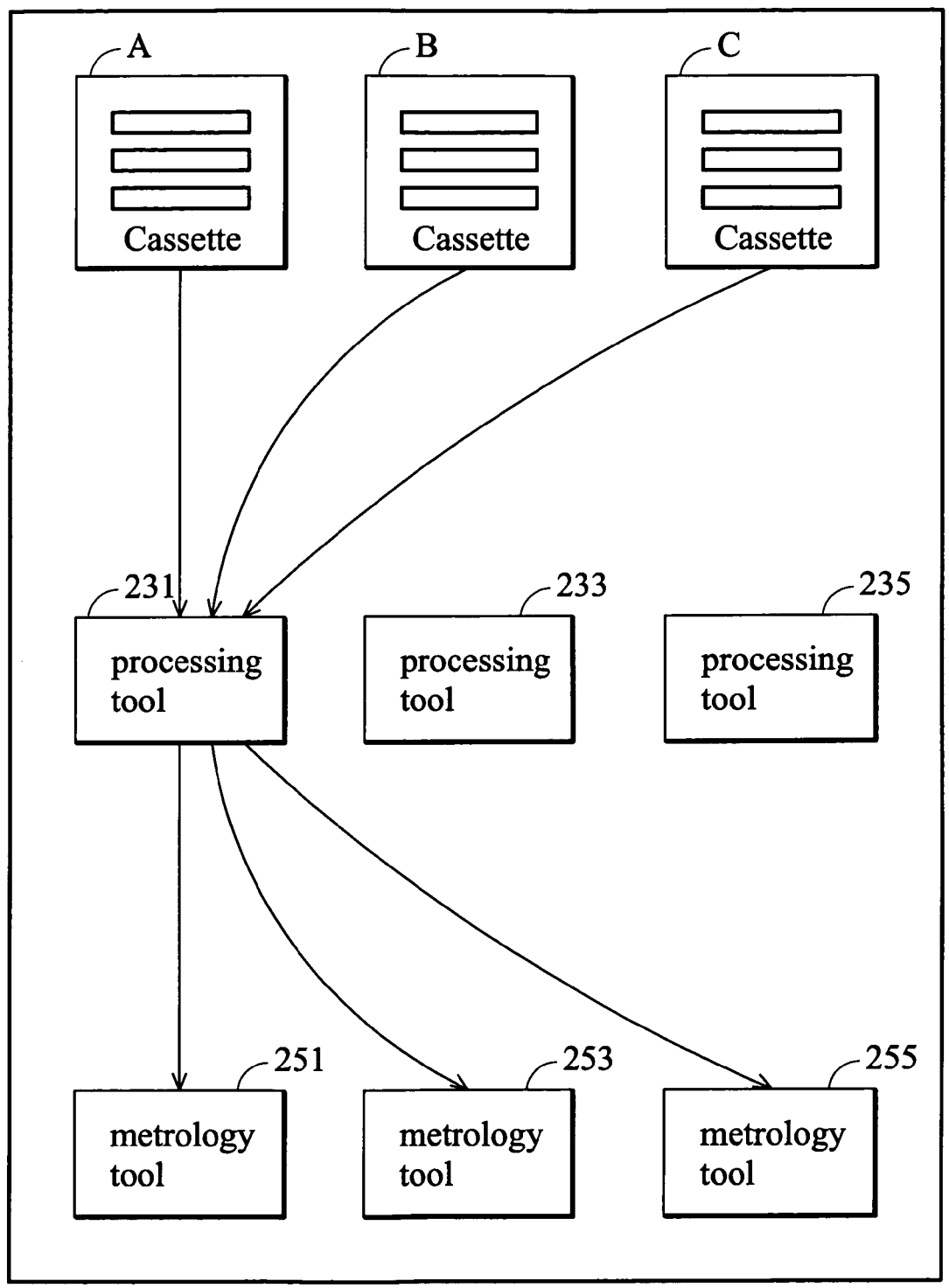
FIGS. 5A~5C illustrate operation of control wafers in an embodiment of tool monitoring.
Figure 5B:
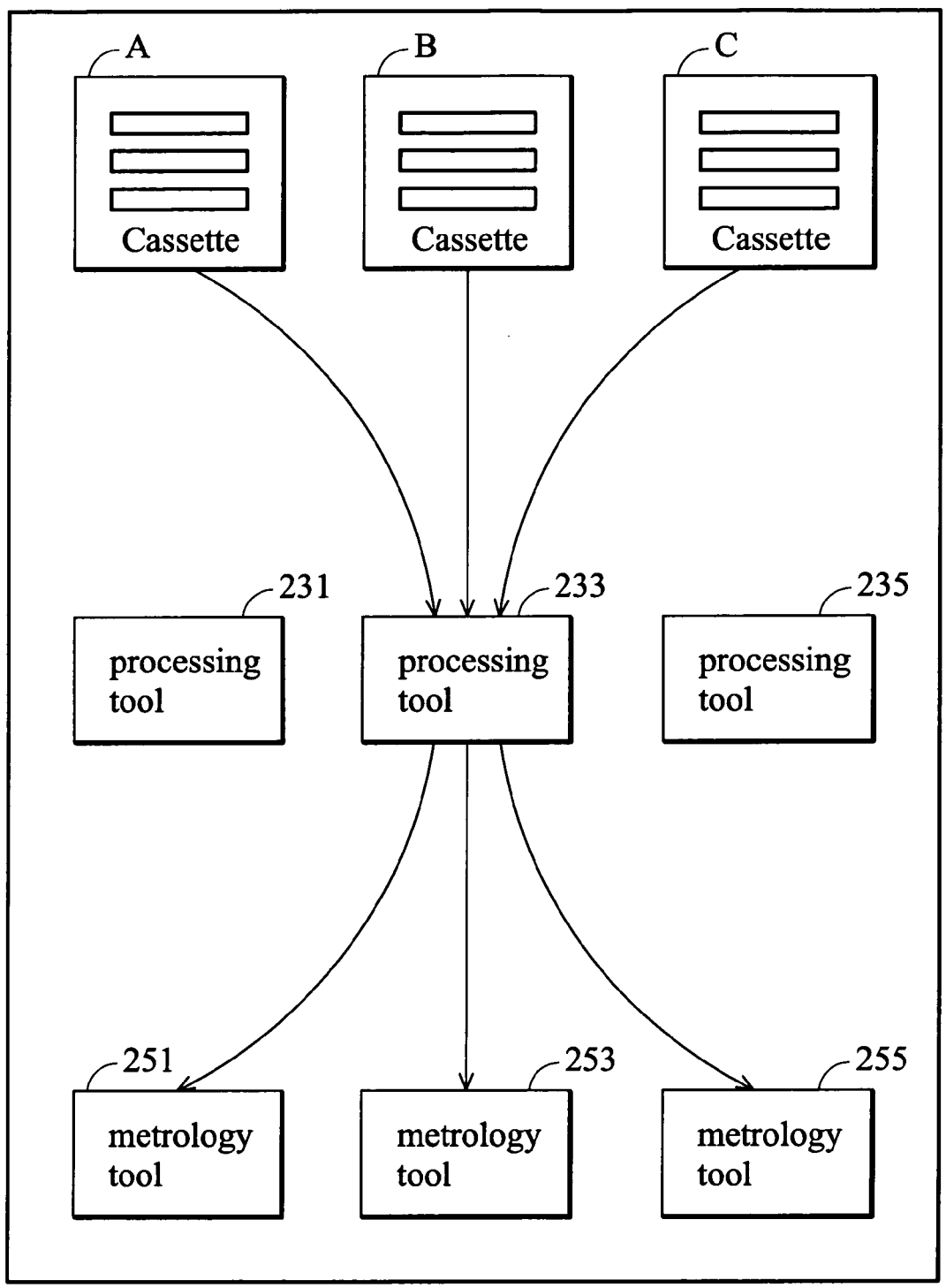
Figure 5C:
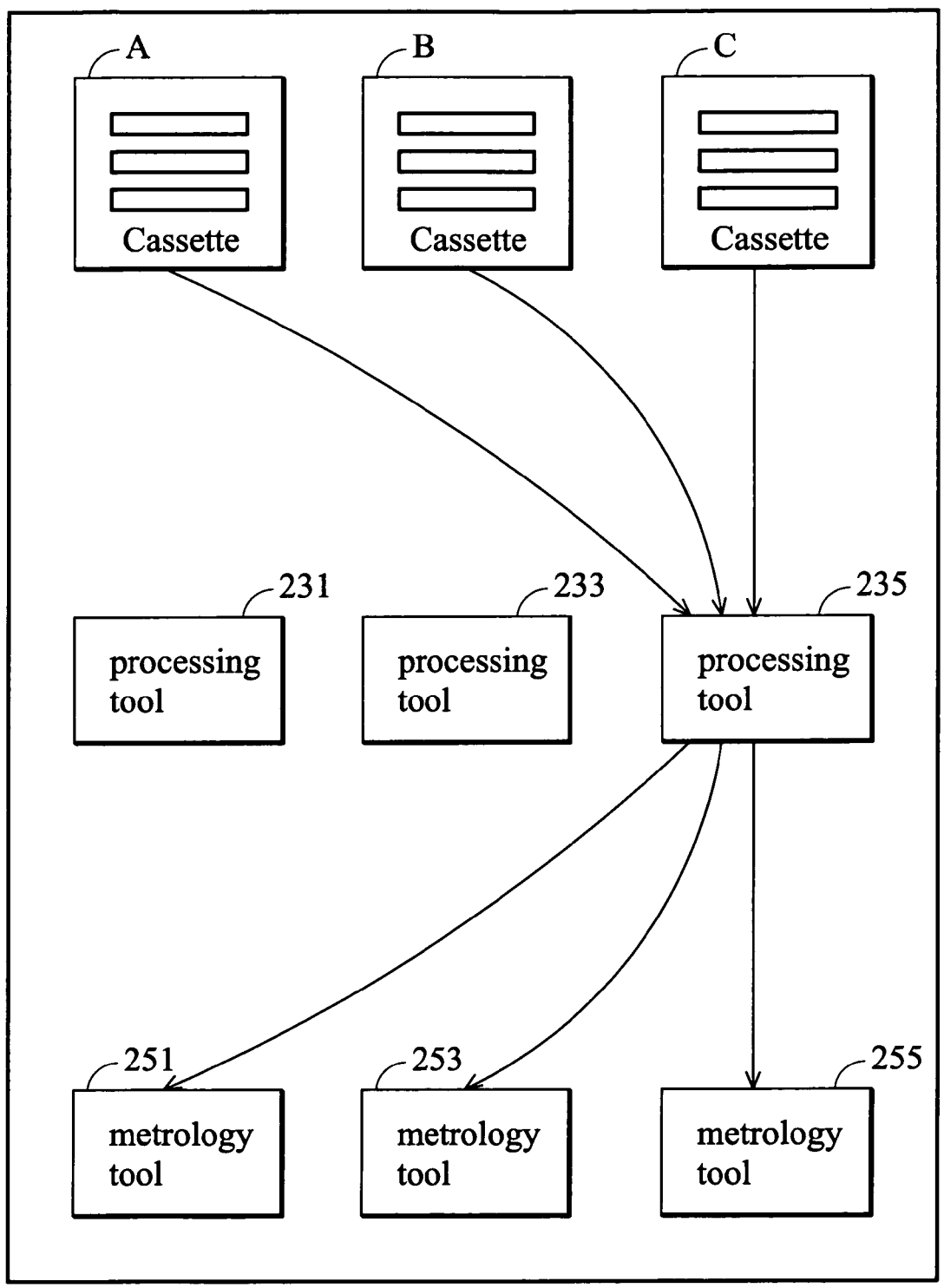

Here, an embodiment of tool monitoring is provided. The tool monitoring process detailed here can be implemented in the manufacturing system illustrated in FIG. 2. FIGS. 4A~4C illustrate operation of a particular cassette of control wafers in an embodiment of tool monitoring. FIGS. 5A~5C illustrate operation of control wafers for monitoring a particular tool in an embodiment of tool monitoring.

In this embodiment, 3 types of control wafer are used for monitoring processing tools 231, 233, and 235. For example, cassette A comprises control wafers A1~A25 used for a particle monitoring process; cassette B comprises control wafers B1~B25 used for a thickness monitoring process; and cassette C comprises control wafers C1~C25 used for an overlay monitoring process. The metrology tool 251 performs a particle metrology process. The metrology tool 253 performs a thickness metrology process. The metrology tool 255 performs an overlay metrology process.

Using FIG. 4A as an example, control wafers A1~A25 contained in cassette A are used for monitoring processing tools 231, 233, and 235. When processing tool 231 is to be monitored, cassette A is transported and loaded onto a load port of the processing tool 231. After the cassette A is loaded onto processing tool 231, one of the control wafers A1~A25 is processed by the processing tool 231. Here, control wafer A1 is selected and processed by the processing tool 231. The cassette A containing control wafers A1~A25 is then transported to the metrology tool 251. Then cassette A is then loaded onto the metrology tool 251, and a particle metrology process is performed on control wafer A1.

When processing tool 233 is to be monitored, cassette A is transported and loaded onto a load port of the processing tool 233. After the cassette A is loaded onto processing tool 233, one of the control wafers A2~A25 is processed by the processing tool 233. Here, control wafer A2 is selected and processed by the processing tool 233. The cassette A containing control wafers A2~A25 is then transported to the metrology tool 251. Then cassette A is then loaded onto the metrology tool 251, and a particle metrology process is performed on control wafer A2.

When processing tool 235 is to be monitored, cassette A is transported and loaded onto a load port of the processing tool 235. After the cassette A is loaded onto processing tool 235, one of the control wafers A3~A25 is processed by the processing tool 235. Here, control wafer A3 is selected and processed by the processing tool 235. The cassette A containing control wafers A3~A25 is then transported to the metrology tool 251. Then cassette A is then loaded onto the metrology tool 251, and a particle metrology process is performed on control wafer A3.

Using FIG. 4B as an example, control wafers contained in cassette B are used for monitoring processing tools 231, 233, and 235. When processing tool 231 is to be monitored, cassette B is transported and loaded onto a load port of the processing tool 231. After the cassette B is loaded onto processing tool 231, one of the control wafers B1~B25 is processed by the processing tool 231. Here, control wafer B1 is selected and processed by the processing tool 231. The cassette B containing control wafers B1~B25 is then transported to the metrology tool 253. Then cassette B is then loaded onto the metrology tool 253, and a thickness metrology process is performed on control wafer B1.

When processing tool 233 is to be monitored, cassette B is transported and loaded onto a load port of the processing tool 233. After the cassette B is loaded onto processing tool 233, one of the control wafers B2~B25 is processed by the processing tool 233. Here, control wafer B2 is selected and processed by the processing tool 233. The cassette B containing control wafers B2~B25 is then transported to the metrology tool 253. Then cassette B is then loaded onto the metrology tool 253, and a thickness metrology process is performed on control wafer B2.

When processing tool 235 is to be monitored, cassette B is Transported and loaded onto a load port of the processing tool 235. After the cassette B is loaded onto processing tool 235, one of the control wafers B3~B25 is processed by the processing tool 235. Here, control wafer B3 is selected and processed by the processing tool 235. The cassette B containing control wafers B3~B25 is then transported to the metrology tool 253. Then cassette B is then loaded onto the metrology tool 253, and a thickness metrology process is performed on control wafer B3.

Using FIG. 4C as an example, control wafers contained in cassette C are used for monitoring processing tools 231, 233, and 235. When processing tool 231 is to be monitored, cassette C is transported and loaded onto a load port of the processing tool 231. After the cassette C is loaded onto processing tool 231, one of the control wafers C1~C25 is processed by the processing tool 231. Here, control wafer C1 is selected and processed by the processing tool 231. The cassette C containing control wafers C1~C25 is then transported to the metrology tool 255. Then cassette C is then loaded onto the metrology tool 255, and an overlay metrology process is performed on control wafer C1.

When processing tool 233 is to be monitored, cassette C is transported and loaded onto a load port of the processing tool 233. After the cassette C is loaded onto processing tool 233, one of the control wafers C2~C25 is processed by the processing tool 233. Here, control wafer C2 is selected and processed by the processing tool 233. The cassette C containing control wafers C2~C25 is then transported to the metrology tool 255. Cassette C is then loaded onto the metrology tool 255, and an overlay metrology process is performed on control wafer C2.

When processing tool 235 is to be monitored, cassette C is transported and loaded onto a load port of the processing tool 235. After the cassette C is loaded onto processing tool 235, one of the control wafers C3~C25 is processed by the processing tool 235. Here, control wafer C3 is selected and processed by the processing tool 235. The cassette C containing control wafers C3~C25 is then transported to the metrology tool 255. Cassette C is then loaded onto the metrology tool 255, and an overlay metrology process is performed on control wafer C3.

FIGS. 5A~5C illustrate control wafer operation for monitoring a particular processing tool. Using FIG. 5A as an example, when processing tool 231 is to be monitored, cassettes A, B, and C are transported loaded thereto, respectively. The processing tool 231 receives cassette A and processes control wafer A1, receives cassette B and processes control wafer B1, and receives cassette C and processes control wafer C1. The control wafers A1, B1, and C1 processed by the processing tool 231 undergo particle, thickness, and overlay metrology processes performed by the metrology tools 251, 253, and 255, respectively.

Using FIG. 5B as an example, when processing tool 233 is to be monitored, cassettes A, B, and C are transported and loaded thereon, respectively. The processing tool 233 receives cassette A and processes control wafer A2, receives cassette B and processes control wafer B2, and receives cassette C and processes control wafer C2. The control wafers A2, B2, and C2 processed by the processing tool 233 undergo particle, thickness, and overlay metrology processes performed by the metrology tools 251, 253, and 255, respectively.

Using FIG. 5C as an example, when processing tool 235 is to be monitored, cassettes A, B, and C are transported and loaded thereon, respectively. The processing tool 235 receives cassette A and processes control wafer A3, receives cassette B and processes control wafer B3, and receives cassette C and processes control wafer C3. The control wafers A3, B3, and C3 processed by the processing tool 235 undergo particle, thickness, and overlay metrology processes performed by the metrology tools 251, 253, and 255, respectively.

In the described embodiments, no wafer sorting is required, and tool monitoring can be implemented more effectively.

While the invention has been described by way of example and in terms of the preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for tool monitoring, comprising:
   providing a first cassette containing a plurality of first control wafers used for a first metrology process;
   loading the first cassette onto a first processing tool;
   processing one of the first control wafers using the first processing tool;
   loading the first cassette onto a first metrology tool;
   using the first metrology tool to perform the first metrology process on the first control wafer processed by the first processing tool;
   providing a second cassette containing a plurality of second control wafers used for a second metrology process;
   loading the second cassette onto the first processing tool;
   processing one of the second control wafers using the first processing tool;
   loading the second cassette onto a second metrology tool; and
   using the second metrology tool to perform the second metrology process on the second control wafer processed by the first processing tool.

2. A method for tool monitoring, comprising:
   providing a first cassette containing a plurality of first control wafers used for a first metrology process;
   loading the first cassette onto a first processing tool;
   processing one of the first control wafers using the first processing tool;
   loading the first cassette onto a first metrology tool;
   using the first metrology tool to perform the first metrology process on the first control wafer processed by the first processing tool;
   loading the first cassette to a second processing tool;
   processing one of the first control wafers using the second processing tool;
   loading the first cassette to the first metrology tool;
   using the first metrology tool to perform the first metrology process on the first control wafer processed by the second processing tool.

3. A method for tool monitoring, comprising:
   providing a first cassette containing a plurality of first control wafers used for a first metrology process;
   loading the first cassette onto a first processing tool;
   processing one of the first control wafers using the first processing tool;
   loading the first cassette onto a first metrology tool;
   using the first metrology tool to perform the first metrology process on the first control wafer processed by the first processing tool;
   providing a second cassette containing a plurality of second control wafers used for a second metrology process;
   loading the second cassette onto a second processing tool;
   processing one of the second control wafers using the second processing tool;
   loading the second cassette onto a second metrology tool; and
   using the second metrology tool to perform the second metrology process on the second control wafer processed by the second processing tool.

* * * * *